United States Patent
Todd

(10) Patent No.: US 9,990,870 B2
(45) Date of Patent: Jun. 5, 2018

(54) MODULAR ART-POST ASSEMBLY AND METHOD OF USING THE SAME

(71) Applicant: Magnet Works, Ltd., St. Louis, MO (US)

(72) Inventor: Curtis L. Todd, St. Louis, MO (US)

(73) Assignee: Magnet Works, Ltd., St. Louis, MO (US)

( * ) Notice: Subject to any disclaimer, the term of this patent is extended or adjusted under 35 U.S.C. 154(b) by 0 days. days.

(21) Appl. No.: 15/495,664

(22) Filed: Apr. 24, 2017

(65) Prior Publication Data

US 2017/0229049 A1 Aug. 10, 2017

Related U.S. Application Data

(63) Continuation of application No. 14/712,649, filed on May 14, 2015, now Pat. No. 9,633,586, which is a continuation of application No. 13/828,115, filed on Mar. 14, 2013, now Pat. No. 9,058,756.

(51) Int. Cl.
*G09F 15/00* (2006.01)
*E04H 12/22* (2006.01)
*G09F 7/18* (2006.01)

(52) U.S. Cl.
CPC ..... *G09F 15/0075* (2013.01); *E04H 12/2223* (2013.01); *E04H 12/2238* (2013.01); *E04H 12/2269* (2013.01); *G09F 7/18* (2013.01); *G09F 15/0037* (2013.01); *G09F 2007/1804* (2013.01); *G09F 2007/1852* (2013.01)

(58) Field of Classification Search
CPC ............... G09F 7/18; G09F 2007/1852; G09F 2007/1804; G09F 15/0037; G09F 15/00; E01F 9/0118; A45F 3/44
See application file for complete search history.

(56) References Cited

U.S. PATENT DOCUMENTS

| | | |
|---|---|---|
| 2,715,386 A | 8/1955 | Jones |
| 3,156,418 A | 11/1964 | Jablonski |
| 5,044,319 A | 9/1991 | Blasbalg |
| (Continued) | | |

OTHER PUBLICATIONS

Peace Pole Makers USA; "The Original Peace Pole Makers", 2 pages; dated 2009 available at http://www.peacepoles.com/ (visited Jun. 14, 2013).

(Continued)

*Primary Examiner* — Cassandra H Davis
(74) *Attorney, Agent, or Firm* — Nixon Peabody LLP

(57) ABSTRACT

An outdoor art-post assembly includes an elongate support pole, an art post, and at least one mounting mechanism. The elongate support pole has a lower portion and an auger disposed at the lower portion. The auger allows for vertical installation of the support pole in soil in response to manual rotation of the support pole. The art post has an inner surface defining a bore. The bore is capable of receiving at least a portion of the elongate support pole. The art post also has an outer surface including decorative indicia thereon. The mounting mechanism is located on the support pole and has protruding portions extending away from the support pole. The protruding portions are configured to contact the inner surface of the art post and affix the art post relative to the support pole. Methods of assembling the same are also disclosed.

18 Claims, 4 Drawing Sheets

(56) References Cited

U.S. PATENT DOCUMENTS

| | | | |
|---|---|---|---|
| 5,095,847 A | 3/1992 | Coffer | |
| 5,195,460 A | 3/1993 | Loken | |
| 5,209,057 A | 5/1993 | Remlaoui | |
| 5,209,959 A | 5/1993 | McNaul | |
| 5,289,796 A | 3/1994 | Armstrong | |
| 5,435,268 A | 7/1995 | Liethen | |
| 5,533,467 A | 7/1996 | Lancia | |
| 5,704,188 A * | 1/1998 | Coulis | E04C 3/36 248/156 |
| 5,962,368 A * | 10/1999 | Poole | B41M 5/0353 156/235 |
| 5,976,296 A * | 11/1999 | Sherman | B29C 63/42 156/230 |
| 6,386,142 B1 | 5/2002 | Holscher | |
| 6,467,756 B1 * | 10/2002 | Elsasser | E04H 12/2215 248/156 |
| 2004/0163336 A1 | 8/2004 | Hsu | |
| 2005/0247920 A1 | 11/2005 | Burkart | |
| 2007/0145225 A1 * | 6/2007 | Bondy | E04H 12/2223 248/530 |
| 2008/0296545 A1 * | 12/2008 | Chef | E04H 17/16 256/1 |
| 2010/0243975 A1 * | 9/2010 | Stover | E04H 17/24 256/1 |
| 2013/0006067 A1 | 1/2013 | Foucher | |
| 2013/0008067 A1 | 1/2013 | Demarco | |

OTHER PUBLICATIONS

Peace Pole Makers USA; "4 Sided Peace Pole with 4 Languages", 2 pages; dated 2008 available at http://stores.bigwaterhostong.com/mm5/merchant.mvc?Screen=PROD&Store_Code=peacepoles&Product_Code=PP4sided4&Category_Code=peace_poles (visited Jun. 14, 2013).

Peace Pole Makers USA; "Peace Pole Accessories", 2 pages; dated 2008 available at http://stores.bigwaterhostong.com/mm5/merchant.myc?Screen=CTGY&Store_Code=peacepoles&Category_Code=peace_pole_accessories (visited Jun. 14, 2013).

* cited by examiner

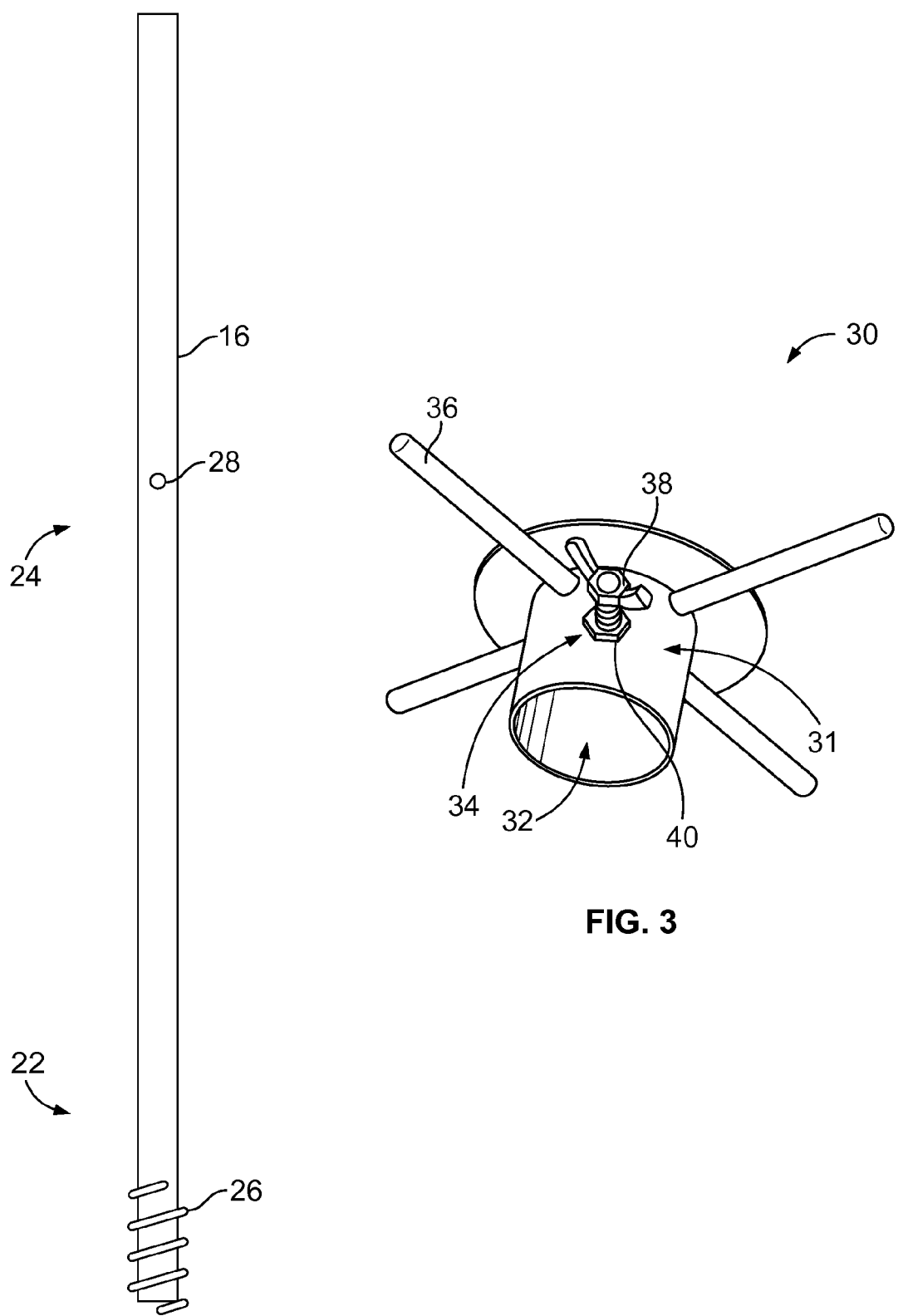

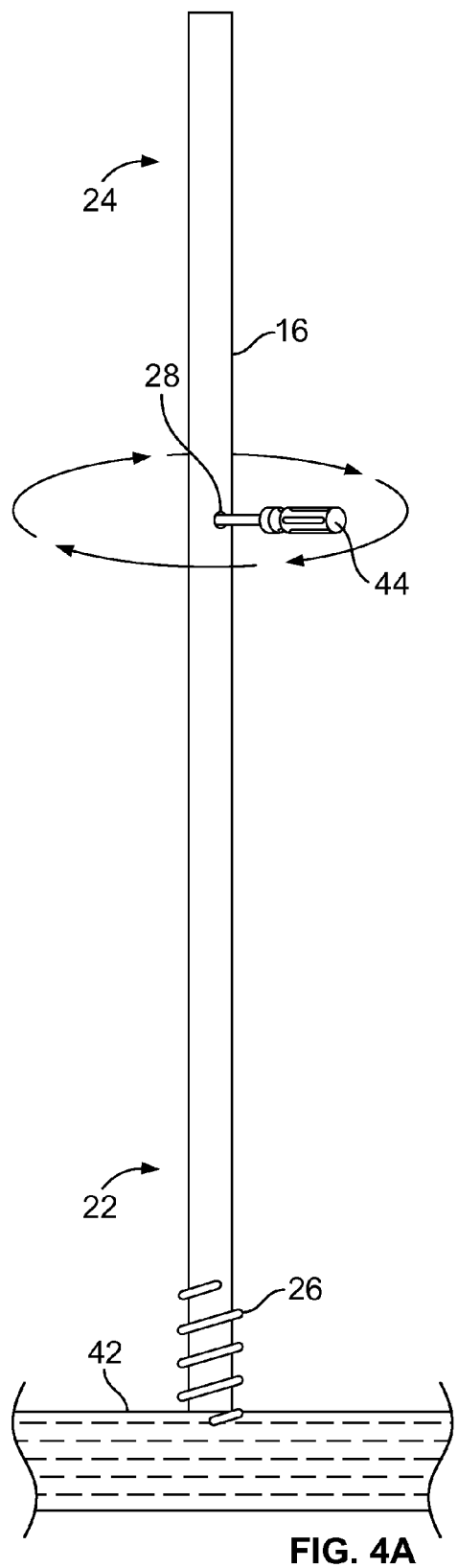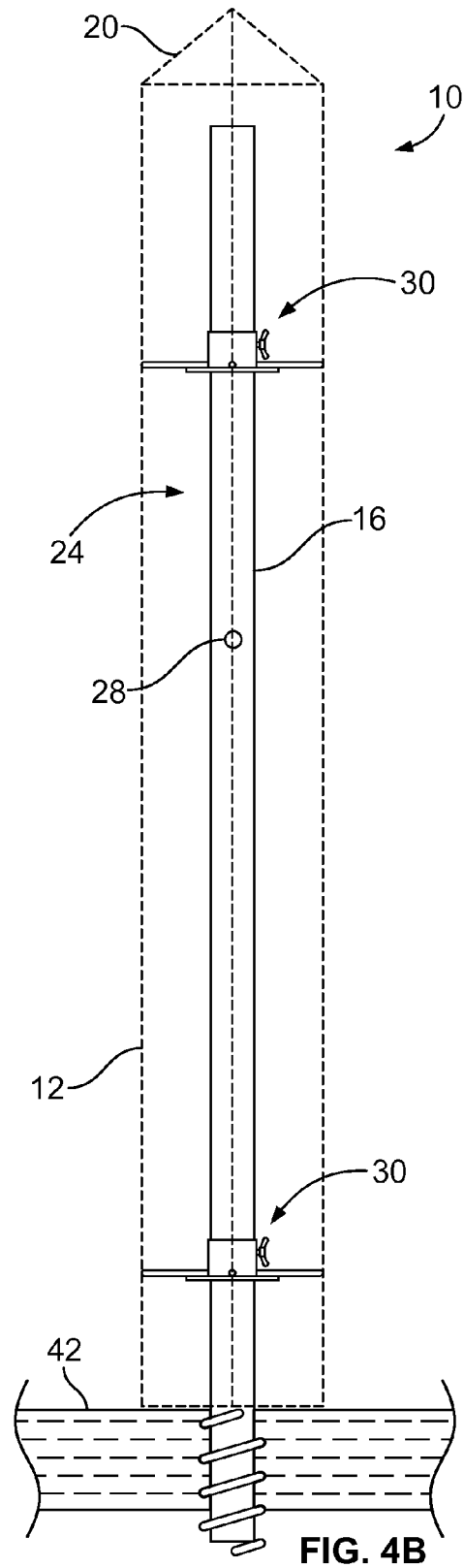

MODULAR ART-POST ASSEMBLY AND METHOD OF USING THE SAME

CROSS-RELATED APPLICATIONS

This application is a continuation of U.S. patent application Ser. No. 14/712,649, filed May 14, 2014, and titled "Modular Art-Post Assembly And Method Of Using The Same," now allowed, which is a continuation of U.S. patent application Ser. No. 13/828,115, filed Mar. 14, 2013, and titled "Modular Art-Post Assembly And Method Of Using The Same," now issued as U.S. Pat. No. 9,058,756, each of which is herein incorporated by reference in entirety.

FIELD OF THE INVENTION

The present invention generally relates to decorative art posts that can be placed outdoors and, more particularly, to a modular art-post assembly and method of using the same.

BACKGROUND OF THE INVENTION

People have a desire to decorate outdoor spaces such as lawns, gardens, and patios with decorative items such as decorative posts. One problem with current decorative posts is the cost of the materials used. For example, current decorative posts such as the "Peace Pole" are typically made from solid wood. Not only is such a decorative post costly, it is also bulky and difficult to mount, change, and/or replace, especially for persons of slight physical stature.

What is more, these decorative posts require a post hole, cement, and backfill in order to mount the post vertically in soil. This is a labor intensive process that requires substantial physical exertion and is prone to errors that may not appear until after the ground has "settled."

Another problem with current decorative posts is that an artist has to place decorative indicia on each post by hand, increasing the labor needed to produce each post and, thus, the cost of each decorative post. Some decorative posts include removable placards having decorative indicia thereon, for example a white plastic placard with lettering thereon. While such placards can be mass-produced, they detract from the aesthetic desirability of the decorative post.

An additional problem arises when a person wants the decorative post mounted in a location without soil or when the person is physically incapable of mounting the decorative post in the soil.

The present invention is directed to solving these problems by providing a decorative art post assembly that is modular, low-cost, lightweight, easily mounted in either soil or on flat surfaces and easily replaced.

SUMMARY OF THE INVENTION

In accordance with one embodiment, an outdoor art-post assembly includes an elongate support pole, an art post, and at least one mounting mechanism. The elongate support pole has a lower portion and an auger disposed at the lower portion. The auger allows for vertical installation of the support pole in soil in response to manual rotation of the support pole. The art post has an inner surface defining a bore. The bore is capable of receiving at least a portion of the elongate support pole. The art post also has an outer surface including decorative indicia thereon. The mounting mechanism is located on the support pole and has protruding portions extending away from the support pole. The protruding portions are configured to contact the inner surface of the art post and affix the art post relative to the support pole.

In accordance with another embodiment, a method of installing a modular art-post assembly having an art post with decorative indicia thereon includes mounting an elongate support pole substantially vertically and placing an art post over the elongate support pole. The art post is made of a polymeric material and includes a bore therethrough. At least a portion of the support pole is disposed within the art post and is affixed to the support pole via a mounting mechanism coupled to the support pole.

In accordance with yet another embodiment, an outdoor art-post assembly, includes an elongate support pole, an art post, and at least one mounting mechanism. The elongate support pole has an auger disposed about an end of the support pole. The auger allows for installation of the support pole in soil in response to manual rotation of the support pole. The art post has multiple sides with decorative indicia thereon. The art post also has an interior surface defining a bore for receiving at least a portion of the elongate support pole. The art post is polymeric and includes a thin film located on the multiple sides. The thin film includes the decorative indicia. The mounting mechanism is affixed on the support pole. The mounting mechanism is adjustably positioned along a length of the support pole. The mounting mechanism has a post-engagement mechanism with multiple protrusions radially spaced about the mounting mechanism. Each protrusion is configured to contact a respective portion of the interior surface of the art post to inhibit rotation of the art post relative to the support pole.

BRIEF DESCRIPTION OF THE DRAWINGS

The invention may best be understood by reference to the following description taken in conjunction with the accompanying drawings, in which:

FIG. 2 illustrates a side view of a support pole according to aspects of the present invention;

FIG. 3 illustrates a perspective view of a mounting mechanism that can be used with the art-post assembly of FIGS. 1 and 2;

FIGS. 4A and 4B illustrate installation of the art-post assembly of FIGS. 1-3;

DETAILED DESCRIPTION OF ILLUSTRATED EMBODIMENTS

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
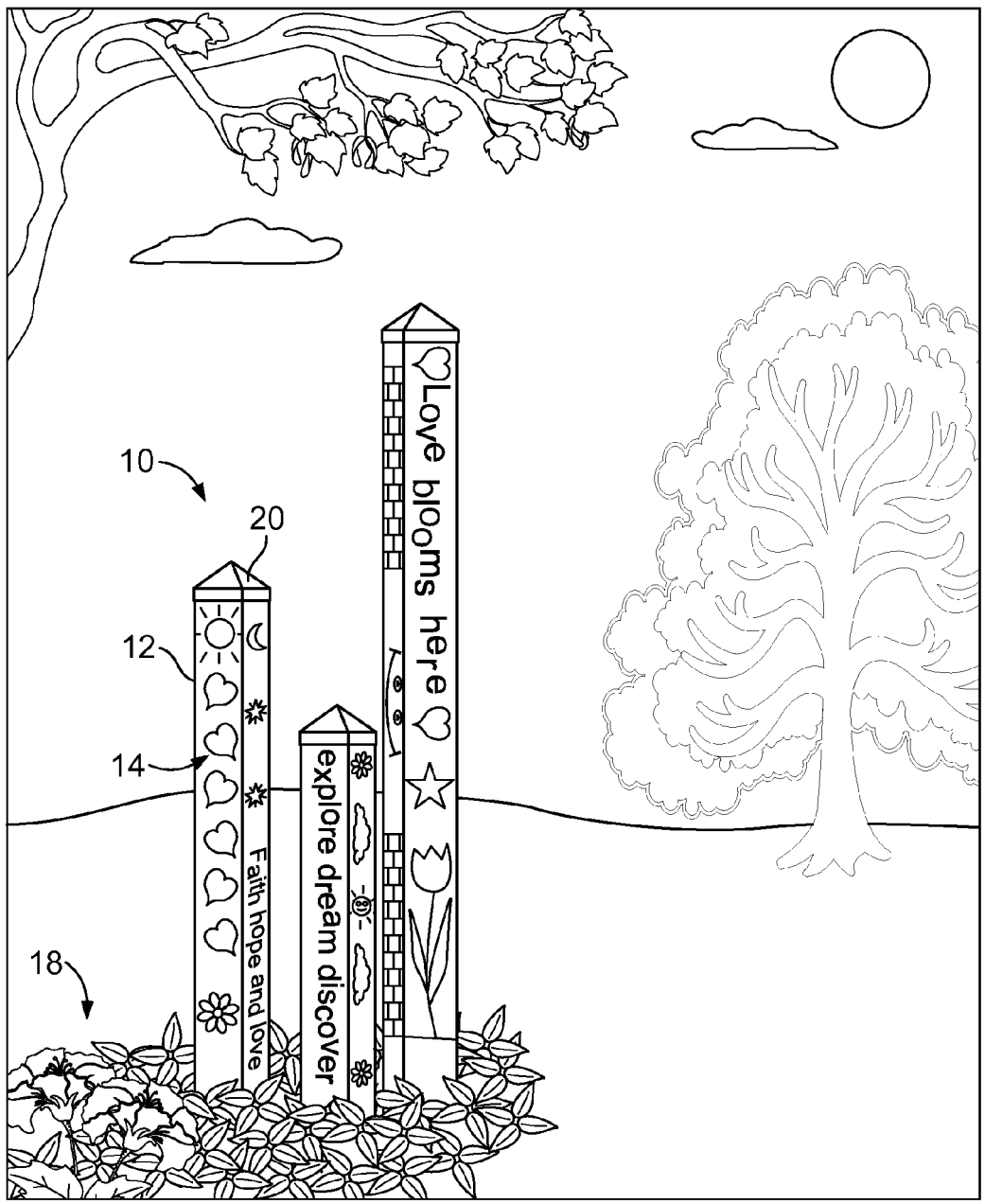
FIG. 1 illustrates an outdoor location including a plurality of decorative art post assemblies according to aspects of the present invention.

FIG. 1 illustrates an outdoor location including a plurality of decorative art post assemblies 10. Each decorative art-post assembly 10 includes an art post 12 having decorative indicia 14 thereon. An inner surface (shown in FIGS. 4B and 5B) of the art post 12 defines a bore extending through the length of the art post 12. As will be described in more detail with reference to FIG. 4B, the bore is configured to receive a support pole 16 in order to maintain the vertical orientation of the art post 12. The art posts 12 are configured to be placed in, for example, a landscape 18. The art posts 12 can be provided in a variety of heights.

A top cap 20 is removable from the top of the art post 12. Advantageously, as will be described in more detail with reference to FIG. 4B below, the removable top cap 20 allows the user to see into the bore of the art post 12 while assembling the art-post assembly 10. The top cap 20 can be held in place using a friction-fit between the art post 12 and the top cap 20. For example, a portion of the top cap 20 may fit within and engage a portion of the inner surface defining the bore. Additionally or alternatively, the top cap 20 may receive and engage a portion of the outer perimeter of the art post 12. Alternatively, the top cap 20 may be permanently affixed to the art post 12 using, for example, adhesives, plastic welding, or fasteners such as screws.

The art post 12 is preferably formed using a polymeric material such as polyvinyl chloride (PVC) as a substrate. Polymeric material allows the art post 12 to be lightweight while maintaining a rigid or semi-rigid structure. While the illustrated embodiment shows the art post 12 as having a square cross-section, other cross-sectional shapes may be used. For example, the art post 12 may have a variety of polygonal cross-sectional profiles including triangular or a circular cross-section. Further, the cross-sectional profile of the inner surface may be a different shape than the cross-sectional profile of the outer surface.

The polymeric substrate is covered with a plastic film including the decorative indicia 14 thereon. The plastic film may include multiple layers including layers having a portion of the decorative indicia 14 thereon. The plastic film may be secured to the polymeric substrate using adhesives such as a pressure sensitive adhesive. The plastic film can be a variety of thicknesses.

A UV-protective film is disposed over the decorative indicia 14 to inhibit ultra violet light from interacting with the inks used for the decorative indicia 14. The UV-protective coating inhibits ultraviolet light from passing therethrough, but is substantially transparent to visible light. The UV-protective film is applied over the plastic film that includes the decorative indicia 14. In some aspects, the UV-protective coating is a component of the plastic film including the decorative indicia 14.

FIG. 2 illustrates a side view of a support pole 16 that is used to vertically support the art post 12. The support pole 16 includes a lower portion 22 and an upper portion 24. The lower portion 22 includes an auger 26 configured to engage soil. The upper portion 24 includes a transverse aperture 28 extending transversely through at least a portion of the support pole 16. As will be described in more detail with reference to FIG. 4A below, a tool 44 can be disposed within the transverse aperture 28 and grasped in order to rotate the support pole 16. As will be described in more detail with reference to FIG. 4B below, the minimum height for the art post 12 is approximately the height of a support pole 16 disposed therein.

The support pole 16 is formed from a rigid material capable of withstanding the force needed to mount the support pole 16 and keep the support pole 16 substantially vertical. For example, the support pole 16 can be formed from a rigid material such as metal so that the support pole 16 can withstand being rotated into the soil. The metal is preferably steel.

The auger 26 is formed from a hardened material capable of engaging the soil and driving the support pole 16 into the soil. For example, flighting of the auger 26 can be formed by wrapping metal tubing into a helical pattern around a cylindrical perimeter of the lower portion 22 of the support pole 16. The flighting is fixed relative to the support pole 16 by welding. It is contemplated that different types of flighting can be used including fighting that is flat and wide.

The support pole 16 is preferably hollow so as to reduce the force needed to rotate the support pole 16 into soil because a smaller amount of soil is displaced versus a solid support pole 16. Additionally, the leading edge of the support pole 16 may include cutting features such as a tapered ridge to assist in cutting the soil. In a further advantage, a core of soil is allowed to enter the hollow interior of the support pole 16 and increase resistance of the support pole 16 to movement from vertical. A plurality of apertures or a slit can extend vertically across the fluting of the support pole 16 to allow a user to remove the core of soil using, for example, a screwdriver.

FIG. 3 illustrates a perspective view of a mounting mechanism 30 according to aspects of the present invention. The mounting mechanism 30 includes a mounting bracket 31 having an aperture 32, a locking feature 34 and protrusions 36. The aperture 32 is configured to receive the support pole 16 therein. The locking feature 34 is configured to prevent rotation of the mounting bracket 31 relative to the support pole 16. In one embodiment, the locking feature 34 is a manually operated fastener such as a wing-screw 38 engaging a threaded opening 40 extending transversely from the aperture 32. When the mounting bracket 31 is disposed on the support pole 16, the wing-screw 38 is tightened and contacts an outer surface of the support pole 16. The engagement of the wing-screw 38 with the support pole 16 creates a force-fit that prevents the mounting bracket 31 from rotating around the support pole 16 and from moving vertically along the support pole 16.

The protrusions 36 are configured to contact the inner surface of the art post 12. The protrusions 36 affix the art post 12 relative to the support pole 16. In doing so, the protrusions 36 inhibit rotational movement of the art post 12 relative to the support pole 16.

In the illustrated embodiment, the protrusions 36 extend from the mounting bracket 31 and engage the inner surface at a corner on the inner surface of the art post 12. Each of the four corners contacts a respective protrusion 36. In other embodiments, the inner surface includes four corners and the protrusions 36 include two protrusions 36 configured to engage opposite corners of the inner surface. While the illustrated embodiment shows a plurality of protrusions 36, it is contemplated that protrusions 36 may be replaced by other post-engagement mechanisms 30. For example, the post-engagement mechanism 30 or mounting bracket 31 may include a resilient ring disposed around the support pole 16 to engage the inner surface of the art post 12. In another example, the post-engagement mechanism 30 or mounting bracket 31 may include a flat surface configured to contact a flat surface of the inner surface of the art post 12.

Advantageously, the mounting bracket 31 can be rotated such that the protrusions 36 are oriented at a desired angle prior to creating the force-fit with locking feature 34. This allows for the rotational orientation of the art post 12 to be adjusted without the need to rotate the support pole 16, preventing screwing the support pole 16 further into the soil or backing the support pole 16 out of the soil.

The mounting mechanism 30 may be integrated with the support pole 16. In one nonlimiting example, the mounting mechanism 30 includes a plurality of protruding spokes disposed around the support pole 16. The spokes can be permanently mounted to the support pole 16, or can be removably mounted to the support pole 16. For example, the spokes are made from a plurality of elongated pegs disposed in a plurality of apertures within the support pole 16. The pegs may be threaded and engage threaded portions within the apertures.

In another nonlimiting example, the mounting mechanism 30 includes at least one threaded rod assembly that fits within two opposing apertures in the support post 16 (similar to the aperture 28 of FIG. 2). Each threaded rod assembly includes a threaded rod that has a length that is generally the same length as the interior dimension of the art post 12 as measured between its diagonally opposed interior corners. Thus, the two free ends of the threaded rod are for supporting the opposing interior corners of the art post 12. Preferably, two threaded rod assemblies are installed within two different pairs of apertures, wherein each pair of apertures (and each threaded rod assembly) is disposed at different heights on the support pole 16.

To secure the threaded rod in each threaded rod assembly, two nuts are placed on the rod and are disposed on opposite sides of the support pole 16. The nuts are tightened against the exterior surface of the support pole 16 directly adjacent to their respective apertures. The nuts can be adjusted to select the radial displacement of the rod in the pair of apertures. In some aspects, the radial displacement of the rod is asymmetrical so that the art post 12 is "plumb" while the support pole 16 is canted from vertical. The threaded rods in each threaded rod assembly may include non-threaded portions, or each rod can be threaded along its entire length. The rods can be made from any suitable rigid or semi-rigid material such as metals or polymers. Preferably, the rods are steel.

A rounded engagement cap may be placed on each of the two free ends of the rod to engage opposite interior corners of the art post 12. The caps can be made from any suitable material including metals or polymers. Preferably, the caps are vinyl. The caps can be threaded onto or slid over the end of the rod. In some aspects, the rounded caps are replaced by rounding the ends of the rod.

FIGS. 4A and 4B illustrate installation of the art-post assembly 10 into soil. FIG. 4A illustrates the support pole 16 before engaging the soil and FIG. 4B illustrates the art-post assembly after being fully assembled.

In the illustrated example, the support pole 16 is positioned vertically on a surface 42 of the soil with the lower portion 22 abutting the surface 42. A tool 44 is placed in the transverse aperture 28. The tool 44 is then rotated about the support pole 16 in a direction determined by the orientation of the auger 26 flighting. In the illustrated example, the tool 44 is rotated in a clockwise direction about the support pole 16. The support pole 16 is rotated in response to the tool 44 engaging a wall of the transverse aperture 28. The auger 26 begins to engage the soil. The rotation of the auger 26 forces the support pole 16 downward into engagement with the soil while the support pole 16 remains substantially vertical. While the illustrated embodiment shows a tool 44 being used to rotate the support pole 16, it is contemplated that the mounting mechanism 30 may include protrusions 36 that are strong enough to allow a user to manually rotate the support pole 16 into the soil by grasping and moving the protrusions 36.

The support pole 16 is hollow and the soil disposed within the hollow portion of the support pole 16 remains generally undisturbed while the support pole 16 is rotated into the soil. The support pole 16 is rotated into the soil until the auger 26 sufficiently engages the soil to prevent the support pole 16 from being substantially moved from vertical by, for example, the wind. In one non-limiting example, the support pole 16 is rotated into the soil until the auger 26 is completely submerged below the surface 42. In one nonlimiting example, the length of the support pole 16 is 58 inches and the auger 26 extends between about 4 inches and about 12 inches from the bottom of the support pole 16. In another nonlimiting example, the length of the support pole 16 is 32 inches and the auger 26 extends between about 4 inches and about 12 inches from the bottom of the support pole 16. Preferably, the auger 26 extends between about 6 and about 8 inches from the bottom of the support pole 16.

After positioning the support pole 16, two mounting mechanisms 30 are coupled to the support pole 16. The mounting brackets 31 are received on the support pole 16 and moved to a desired height and rotational position. Once in the desired location, the locking feature of each mounting bracket 31 engages the support pole 16. A force-fit is created that holds the mounting bracket 31 at the desired height and in the desired rotational position. The art post 12 is then fitted over the support pole 16 and the mounting mechanisms 30. The art post 12 may be fitted without the top cap 20 so that the user may view the bore formed by the inner surface of the art post 12 and easily make any adjustments to align the corners of the inner surface with the protrusions 36 of the mounting mechanisms 30. After the art post 12 is in place, the top cap 20 is placed on the art post 12 distal the surface 42 of the soil. In addition to enhanced aesthetics, placement of the top cap 20 generally inhibits material or debris from entering the bore of the art post 12. While the illustrated embodiment shows two mounting mechanisms 30, it is contemplated that fewer or more than two mounting mechanisms 30 may be used. For example, a single mounting mechanism 30 disposed on the upper portion 24 of the support pole 16 may be used to engage the art post 12.

Figure 5A:
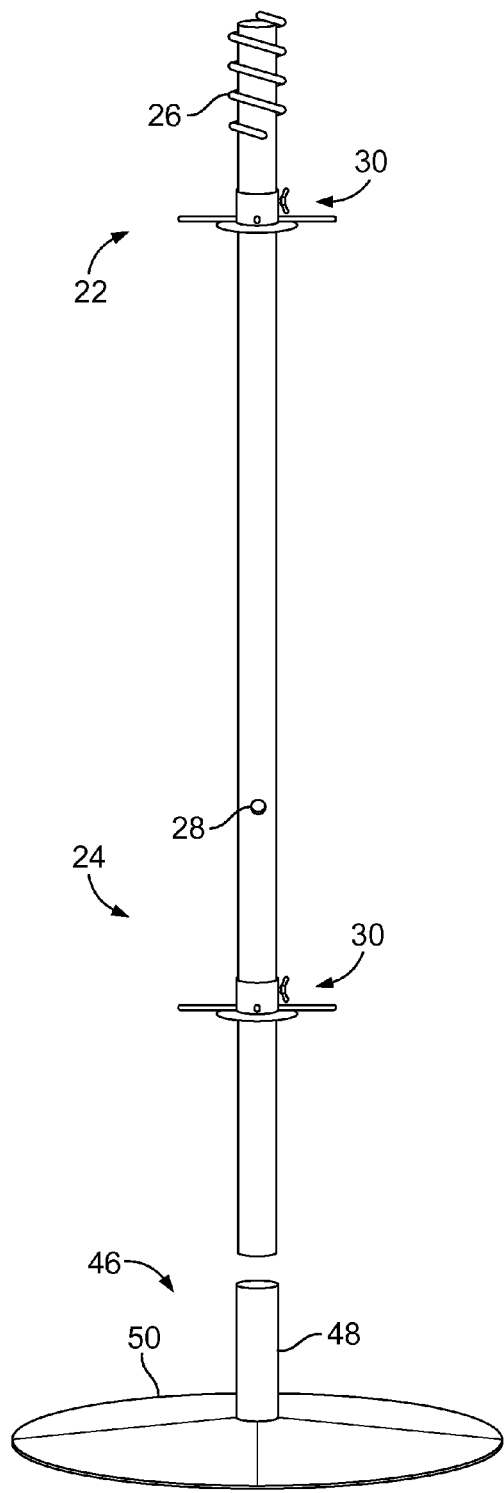
FIGS. 5A and 5B illustrate installation of the art-post assembly of FIGS. 1-3.
Figure 5B:
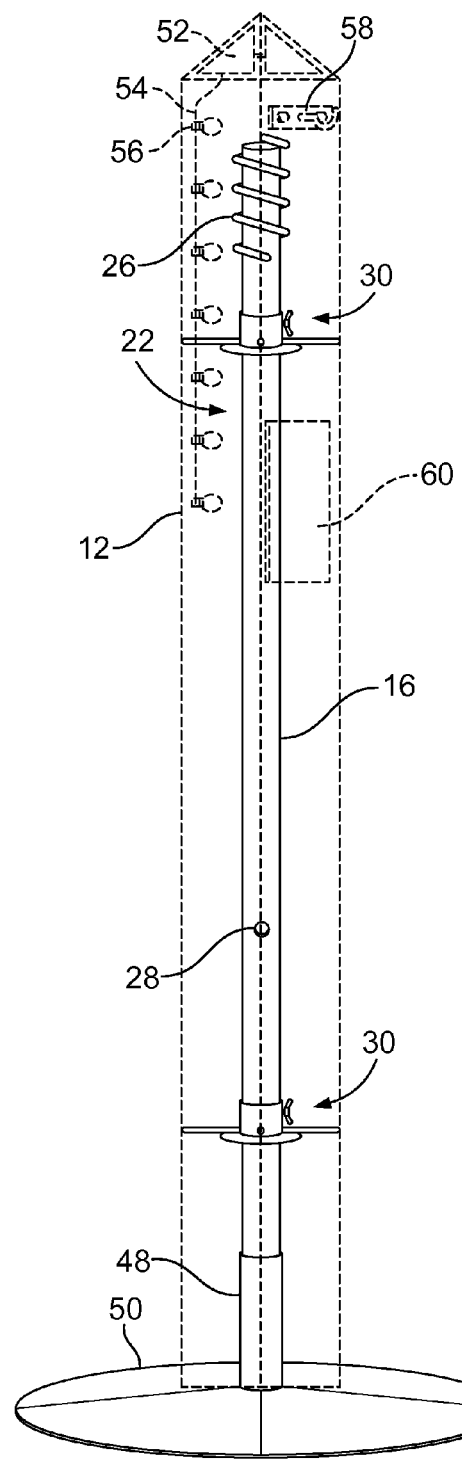

FIGS. 5A and 5B illustrate installation of the art-post assembly 10 on a horizontal outdoor surface in which use of the auger 26 is impossible or unlikely (e.g., a patio or deck). FIG. 5A illustrates the support pole 16 before engaging a mounting base 46 and FIG. 5B illustrates the art-post assembly after being fully assembled with the mounting base 46. The mounting base 46 is configured to engage the support pole 16 and optionally hold the support pole 16 substantially vertically on a horizontal outdoor surface instead of vertically supporting the support pole 16 in the soil via the auger 26. The mounting base 46 includes a receiver 48 and a platform 50. The receiver 48 is configured to engage a portion of the support pole 16 and the base 50 is configured to prevent the support pole 16 from being substantially moved from vertical by, for example, the wind.

As described above, the mounting mechanisms 30 are received on the support pole 16 and moved to a desired height and rotational position. Once in the desired location, the locking feature of each mounting bracket 31 engages the support pole 16. A force-fit is created that holds the mounting bracket 31 at the desired height and in the desired rotational position. Then, the support pole 16 is vertically oriented such that the auger 26 is distal the mounting base 46. The upper portion 24 of the support pole 16 is engaged by the receiver 48 and the support pole 16 is held substantially upright. As noted above, the art post 12 is then fitted over the support pole 16 and the mounting mechanisms 30. The art post 12 may be fitted without the top cap 20 so that the user may view the bore formed by the inner surface of the art post 12.

The top cap 20 is shaped to engage all sides of the art post 12 and extends upward to a point, resulting in a generally pyramidal shape. The top cap 20 can include similar decorative indicia 14 to those on the art post 12. Alternatively, the top cap 20 can be different decorative indicia 14 or colors. In one non-limiting example, the top cap 20 includes stained glass which may provide aesthetically pleasing artwork when lit by internal lights, as described below.

The top cap 20 can also include functional features such as a solar-energy collector 52 for collecting and storing electrical power (e.g., a solar panel coupled to a battery). A strand 54 including lights 56 may be attached to the solar-energy collector 52. The lights 56 may be mounted internally or externally. For example, the lights 56 may be free-hanging within the hollow portion of the art post 12. Apertures can be included through the polymeric substrate of the art post 12 but not through the thin film. The apertures would allow the hanging lights 56 to back-light portions of the thin film. This allows additional decorative indicia 14, such as stars that are lit and/or twinkle. The lights 56 may also be mounted externally near the top cap 20 or at the bottom of the art post 12. The externally mounted lights can be used to light the art post 12 during low-light conditions, such as at night.

The art post 12 may also include mounting brackets 58. The mounting bracket 58 can be attached to the art post 12 by being fastened through the substrate. For example, the mounting bracket 58 includes a plate disposed on the inside of the art post 12 and a plate disposed on the outside of the art post 12. The two plates are bolted together and provide a load-bearing connection. The outer plate can include a hook from which to hang additional items, such as a flower basket.

The art post 12 may also include a plate 60 for magnetically attaching items to the art post 12. The plate 60 may be metallic or magnetic. The metal plate may be adhered or otherwise fastened to the outer surface the art post 12. The plate 60 can be used to magnetically attach placards having text or house numbers, or attach a structural item such as a bracket 58 having a hook for holding small items such as a basket such as flowers.

Alternatively, the substrate of the art post 12 may be routed out to create a thin recess and the plate 60 can be inset within the recess, creating a smooth surface for the decorative indicia 14. In yet another alternative, the plate 60 can be adhered or otherwise fastened to the inner surface of the art post 12. When mounted on the inner surface, the plate 60 is configured to not interfere with the post-engagement mechanism 30. For example, the plate 60 does not extend to the corners of the inner surface so that the protrusions 36 do not contact the plate 60.

The mounting base 46 may be configured to engage different portions of the support pole 16. In one nonlimiting example, the receiver 48 includes an aperture that is large enough to receive the lower end 22 of the support pole 16 including the auger 26. In some aspects, the receiver includes threading to engage the auger 26 flighting. In one nonlimiting example, the receiver is configured to engage the inner surface of the support pole 16.

Advantageously, the modular design of the art-post assembly 10 means that art posts 12 having different decorative indicia 14 can be quickly and easily switched out without having to remove, replace, or modify the support pole 16. In one nonlimiting example, a user displays art posts 12 with seasonally-themed decorative indicia 14. In this example, the user may display an art post 12 having falling leaves and gourds during autumn and may replace that art post 12 with during winter months with an art post 12 having snowflakes, snowmen, and carolers. In another nonlimiting example, the user displays art posts 12 dependent on special occasions. In this example, the user may display an art post 12 having decorative indicia 14 indicating an event such as a holiday or a birthday for a day, several days, or even a month around the day of the event. Additionally, art posts 12 having different heights can be mounted and secured using the same support pole 16.

It will be evident to those skilled in the art that the invention is not limited to the details of the foregoing illustrated embodiment and that the present invention may be embodied in other specific forms without departing from the spirit or essential attributes thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

The invention claimed is:

1. An outdoor art-post assembly, comprising:
an art post having multiple sides walls defining an outer surface with decorative indicia thereon, the multiple sides walls having an inner surface defining a bore, the inner surface being polygonal in cross-section, the art post including a bottom portion and a top portion, the top portion including a cap engaging the multiple side walls and substantially sealing the bore, the art post being polymeric and the outer surface being a continuous surface, a thin film being located on the continuous outer surface such that the thin film extends continuously and uninterruptedly around the art post, the thin film including the decorative indicia;
an elongate support structure being configured to be received by the bore of the art post, the support structure having corner-engaging portions for engaging a first set of corners of the art post to inhibit rotation of the art post relative to the support structure, the support structure having a lower soil-engaging section for installation into soil; and
wherein the art post is configured to be mounted on the elongate support structure by fitting the art post over the top portion of the support structure and engaging the corner-engaging the first set of corners of the art post.

2. The outdoor art-post assembly of claim 1, wherein the support structure includes second corner-engaging portions for engaging a second set of corners of the art post, the second set of corners being different from the first set of corners.

3. The outdoor art-post assembly of claim 1, wherein the corner-engaging portions of the art post are a plurality of protrusions.

4. The outdoor art-post assembly of claim 1, wherein the top cap is a separate component that attaches to the art post.

5. The outdoor art-post assembly of claim 1, further comprising a metal plate on one of the side walls of the art post and a detachable placard, at least one of the metal plate and the detachable placard being magnetic so as to magnetically hold the detachable placard on the art post.

6. The outdoor art-post assembly of claim 1, further comprising a hook coupled to the art post, the hook configured to support items suspended therefrom.

7. The outdoor art-post assembly of claim 1, wherein the elongate support structure includes a mounting mechanism affixed on a support pole, the mounting mechanism having the corner-engaging portions.

8. The outdoor art-post assembly of claim 7, wherein the mounting mechanism is adjustably positioned along a length of the support pole.

9. The outdoor art-post assembly of claim 1, wherein the support structure includes an auger at the lower soil-engaging section.

10. The outdoor art-post assembly of claim 1, further comprising a solar-energy collector and at least one light electrically coupled to the solar-energy collector.

11. An outdoor art-post assembly, comprising:
   an art post having an outer surface and an inner surface defining a bore, the art post being polymeric and including decorative indicia on the outer surface, the outer surface being continuous around the art post such that the decorative indicia extends uninterruptedly and entirely around the art post, the art post including a UV-protection layer for protecting the decorative indicia from UV light;
   an elongate support structure being configured to be received by the bore of the art post, the support structure having engaging portions for engaging the inner surface on the inner surface of the art post to inhibit rotation of the art post relative to the support structure when the art post is fitted over the support structure, the support structure having a lower soil-engaging section for installation into soil; and
   a top cap attachable to an upper end of the art post, the top cap substantially sealing the bore on the art post.

12. The art-post assembly of claim 11, wherein the top cap includes a solar-energy collector for collecting energy that is transferred to at least one light coupled to the art-post assembly, wherein the at least one light is located near a top of the art-post assembly.

13. The art-post assembly of claim 12, wherein the at least one light is located is located internal to the art-post assembly.

14. The art-post assembly of claim 12, wherein the art post includes a PVC substrate with a film layer including the decorative indicia.

15. A method of installing a modular art-post assembly having an art post with decorative indicia thereon, comprising:
   mounting an elongate support structure substantially vertically, the elongate support structure having corner-engaging portions; and
   fitting an art post over the elongate support structure, the art post being made of a polymeric material and including a bore therethrough, at least a portion of the support pole being disposed within bore of the art post, the art post including an outer surface that extends continuously around the art post such that the decorative indicia extends uninterruptedly and entirely around the art post, the art post including a UV-protection layer for protecting the decorative indicia from UV light, the art post being affixed to the support structure by engaging corners of an inner surface of the art post with the corner-engaging portions of the elongate support structure.

16. The method of claim 15, further comprising attaching a hook to the art post, the hook configured to support items suspended therefrom.

17. The method of claim 15, further comprising attaching a detachable placard on the art post, the detachable placard being magnetically held on the art post.

18. The method of claim 15, wherein the art post further includes a solar-energy collector and at least one light, the solar-energy collector being coupled to the art post, the at least one light being electrically coupled to the solar-energy collector.

* * * * *